US010141490B2

(12) United States Patent
Miki et al.

(10) Patent No.: US 10,141,490 B2
(45) Date of Patent: *Nov. 27, 2018

(54) COMPOSITE BASE AND METHOD OF MANUFACTURING LIGHT EMITTING DEVICE

(71) Applicant: NICHIA CORPORATION, Anan-shi, Tokushima (JP)

(72) Inventors: Tomohide Miki, Tokushima (JP); Hideki Hayashi, Anan (JP); Motokiyo Shirahama, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/678,431

(22) Filed: Aug. 16, 2017

(65) Prior Publication Data

US 2018/0053884 A1    Feb. 22, 2018

(30) Foreign Application Priority Data

Aug. 16, 2016   (JP) .................. 2016-159762

(51) Int. Cl.
*H01L 33/62*     (2010.01)
*H01L 33/00*     (2010.01)
*H01L 33/54*     (2010.01)
*H01L 33/56*     (2010.01)
*H01L 33/32*     (2010.01)
*H01L 33/50*     (2010.01)
*H01L 33/60*     (2010.01)

(52) U.S. Cl.
CPC .......... *H01L 33/62* (2013.01); *H01L 33/0095* (2013.01); *H01L 33/54* (2013.01);
(Continued)

(58) Field of Classification Search
CPC ..... H01L 33/0095; H01L 33/20; H01L 33/54; H01L 33/56; H01L 33/60; H01L 33/62; H01L 33/486
(Continued)

(56) References Cited

U.S. PATENT DOCUMENTS

2007/0187709 A1    8/2007   Yamamoto
2007/0246841 A1   10/2007   Yamamoto et al.
(Continued)

FOREIGN PATENT DOCUMENTS

JP    2007-207986 A    8/2007
JP    2007-258495 A   10/2007
(Continued)

*Primary Examiner* — Brook Kebede
(74) *Attorney, Agent, or Firm* — Hunton Andrews Kurth LLP

(57) ABSTRACT

A method of manufacturing a light emitting device includes: providing a light emitting device set that includes a lead frame being plate-like and including pairs of supporting leads each of which pairs consists of a first supporting lead and a second supporting lead, packages respectively supported by the pairs of supporting leads, and light emitting elements respectively mounted on the packages; and removing the packages from the lead frame. The packages each include a resin molded body, the resin molded body includes a first recess open at the first and third outer surfaces, and a second recess open at the second and third outer surfaces. The first supporting lead and the second supporting lead respectively fit into the first recess and the second recess. In the removing step, the packages are each removed from the lead frame by the third outer surface being pushed.

14 Claims, 6 Drawing Sheets

(52) U.S. Cl.
CPC .............. *H01L 33/56* (2013.01); *H01L 33/32* (2013.01); *H01L 33/502* (2013.01); *H01L 33/507* (2013.01); *H01L 33/60* (2013.01); *H01L 2933/005* (2013.01); *H01L 2933/0066* (2013.01)

(58) Field of Classification Search
USPC ...................................... 438/26; 257/98–100
See application file for complete search history.

(56) References Cited

U.S. PATENT DOCUMENTS

| | | |
|---|---|---|
| 2010/0171144 A1 | 7/2010 | Kong et al. |
| 2011/0175127 A1* | 7/2011 | Kanada .................... H01L 33/60 |
| | | 257/98 |
| 2012/0025361 A1 | 2/2012 | Ito et al. |
| 2012/0217046 A1* | 8/2012 | Hu ......................... H01L 33/486 |
| | | 174/255 |
| 2016/0141475 A1* | 5/2016 | Nogi ...................... H01L 33/483 |
| | | 257/99 |
| 2016/0233390 A1* | 8/2016 | Hayashi .................. H01L 33/20 |

FOREIGN PATENT DOCUMENTS

| | | |
|---|---|---|
| JP | 2007-311749 A | 11/2007 |
| JP | 2010-530635 A | 9/2010 |
| JP | 2012-028699 A | 2/2012 |
| JP | 2013-153144 A | 8/2013 |
| JP | 2014-123672 A | 7/2014 |
| JP | 2014-207304 A | 10/2014 |

* cited by examiner

COMPOSITE BASE AND METHOD OF MANUFACTURING LIGHT EMITTING DEVICE

CROSS-REFERENCE TO RELATED APPLICATION

This application claims priority to Japanese Patent Application No. 2016-159762, filed on Aug. 16, 2016, the disclosure of which is hereby incorporated by reference in its entirety.

BACKGROUND

The present disclosure relates to a method of manufacturing a light emitting device and a composite base.

There has been proposed a method of manufacturing a light emitting device including a step of removing a housing from a lead frame to obtain a light emitting device (see Japanese Patent Publication No. 2010-530635).

SUMMARY

According to the method of manufacturing a light emitting device disclosed in Japanese Patent Publication No. 2010-530635, when removing the housing from the lead frame, the housing may be damaged due to applied bending force and shock.

An embodiment of the present disclosure can reduce the possibility of the above-mentioned damages.

In an embodiment of the present disclosure, a method of manufacturing a light emitting device includes: providing a light emitting device set that includes a lead frame being plate-like and including a plurality of pairs of supporting leads each of which pairs is a pair of a first supporting lead and a second supporting lead, a plurality of packages respectively supported by the plurality of pairs of supporting leads, and a plurality of light emitting elements respectively mounted on the plurality of packages; and removing the plurality of packages from the lead frame. The packages each include a resin molded body, the resin molded body includes a first outer surface supported by the first supporting lead, a second outer surface positioned opposite to the first outer surface and supported by the second supporting lead, a third outer surface positioned between the first outer surface and the second outer surface, a fourth outer surface positioned opposite to the third outer surface, a first recess that is open at the first outer surface and the third outer surface, and a second recess that is open at the second outer surface and the third outer surface. The first supporting lead fits into the first recess, and the second supporting lead fits into the second recess. In the removing step, the packages are each removed from the lead frame by the third outer surface being pushed.

In an embodiment of the present disclosure, a composite base includes: a lead frame being plate-like and including a plurality of pairs of supporting leads each of which pairs is a pair of a first supporting lead and a second supporting lead; and a plurality of packages respectively supported by the plurality of pairs of supporting leads. The packages each include a resin molded body. The resin molded body includes a first outer surface supported by the first supporting lead, a second outer surface positioned opposite to the first outer surface and supported by the second supporting lead, a third outer surface positioned between the first outer surface and the second outer surface, a fourth outer surface positioned opposite to the third outer surface, a first recess that is open at the first outer surface and the third outer surface but is not open at the fourth outer surface, and a second recess that is open at the second outer surface and the third outer surface but is not open at the fourth outer surface. The first supporting lead fits into the first recess, and the second supporting lead fits into the second recess.

The method of manufacturing a light emitting device reduces the possibility of damages to the packages. The composite base reduces the risk of unintended removal of the packages from the lead frame.

DETAILED DESCRIPTION OF EMBODIMENTS

Figure 1A:
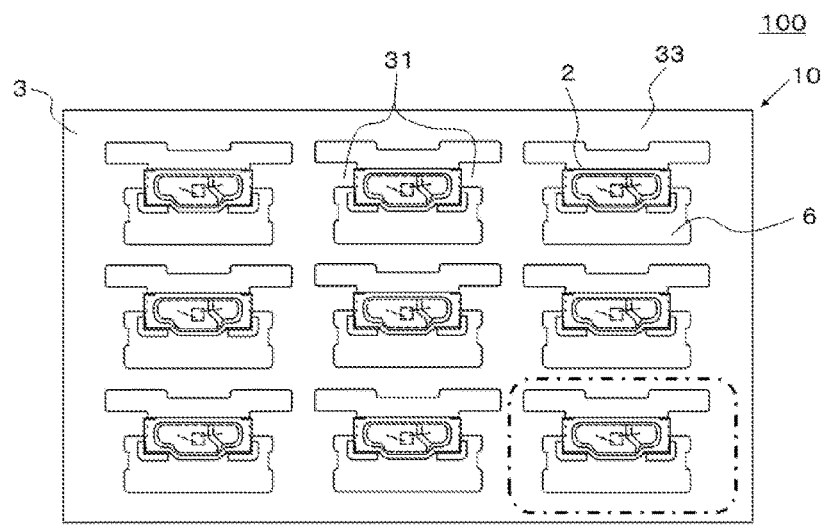
FIG. 1A is a schematic top view of a light emitting device set according to an embodiment of the present disclosure.

In the following, a description will be given of an embodiment of the present disclosure with reference to the drawings as appropriate. Note that, the embodiment described in the following is for embodying the technical idea of the present disclosure, and not intended to limit the technical scope of the present disclosure. Also note that the size, positional relationship and the like of the members shown in the drawings may be exaggerated for the sake of clarity. Those parts denoted by an identical reference character and appear in a plurality of drawings represent an identical part or member. Further, the terms such as a light emitting device or a package may be interchangeably used as appropriate before and after being removed from a lead frame.

A method of manufacturing a light emitting device 1 according to an embodiment of the present disclosure includes providing a light emitting device set 100, and removing a plurality of packages 2 from a lead frame 3. A detailed description thereof is given in the following.

Providing

Figure 1B:
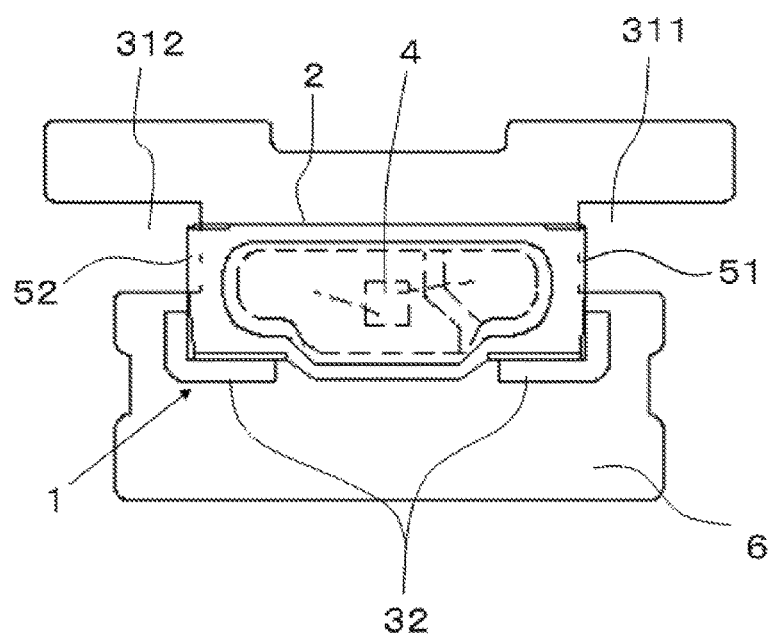
FIG. 1B is a partial enlarged view enlarging a region surrounded by a dashed-dotted line in FIG. 1A.

FIG. 1A is a schematic top view of the light emitting device set 100 according to an embodiment. FIG. 1B is a partial enlarged view enlarging a region surrounded by a dashed-dotted line in FIG. 1A. In the providing step, the light emitting device set 100 shown in FIGS. 1A and 1B are provided. The light emitting device set 100 may be provided by manufacturing the light emitting device set 100, or may be provided in other manner, for example, by purchasing the light emitting device set 100.

The light emitting device set 100 includes a composite base 10 and a plurality of light emitting elements 4. The composite base 10 includes the lead frame 3 and the plurality of packages 2. The plurality of light emitting elements 4 are respectively mounted on the plurality of packages 2.

The lead frame 3 includes a frame body 33, a plurality of pairs of supporting leads 31 each of which pairs is a pair of a first supporting lead 311 and a second supporting lead 312, and a plurality of pairs of electrode leads 32. The supporting leads 31 support the packages 2. The first supporting lead 311 and the second supporting lead 312 are respectively fitted into a first recess 51 and a second recess 52 of a resin molded body 5, which will be described later. The electrode leads 32 supply power to the light emitting elements 4. Each pair of electrode leads 32 is embedded in the resin molded body 5 as part of the light emitting device 1.

The electrode leads 32 are separated from the frame body 33. The electrode leads 32 are separated from the frame body 33 by an operation of cutting linking portions connecting the frame body 33 and the electrode leads 32, performed before the providing step, or after the providing step and before the removing step. The linking portions can be cut by, for example, die cutting or dicing.

The lead frame 3 has a plurality of openings 6. Each of the openings 6 preferably has a shape similar to that of corresponding package 2 as seen in a top view. For example, when the package 2 is substantially quadrangular, the opening 6 is preferably substantially quadrangular similarly to the package 2. The longitudinal and lateral dimensions of the opening 6 are 1.1 to 1.5 times as great as those of the package 2, as seen in a top view. As will be described later, the packages 2 are respectively removed from the lead frame 3 through the openings 6. Here, setting the openings 6 to have the above-described shape and longitudinal and lateral dimensions allows the packages 2 to be readily removed from the lead frame 3 through the openings 6 while securing the yield of the light emitting devices 1 per lead frame 3.

Figure 2A:
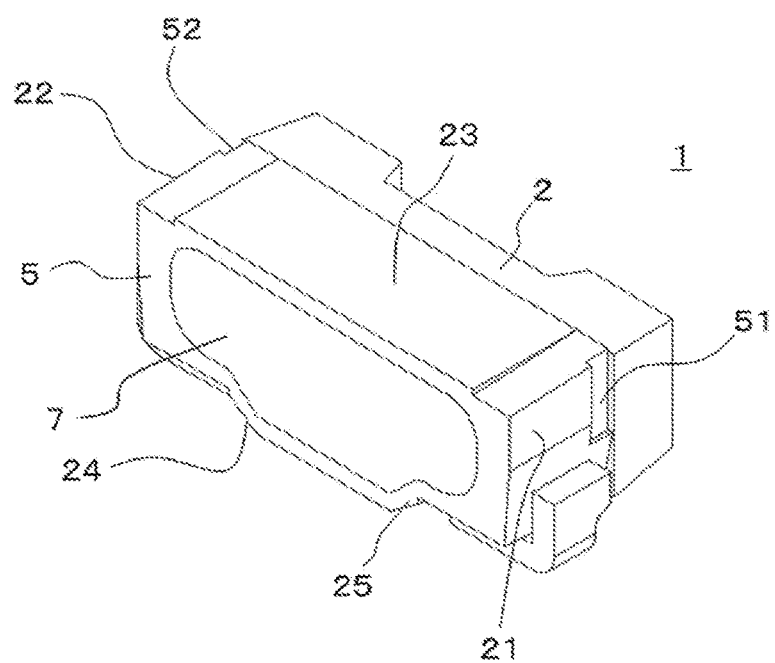
FIG. 2A is a schematic perspective view of a light emitting device according to an embodiment of the present disclosure.
Figure 2B:
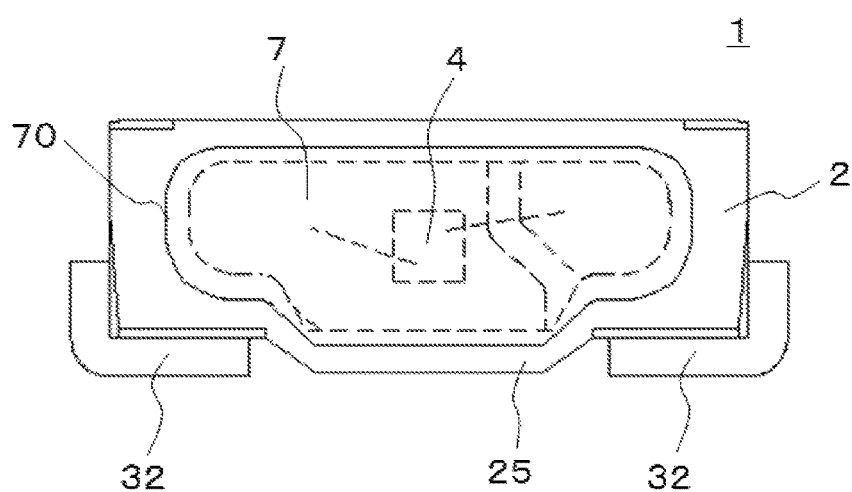
FIG. 2B is a schematic front view of a light emitting device according to an embodiment of the present disclosure.
Figure 2C:
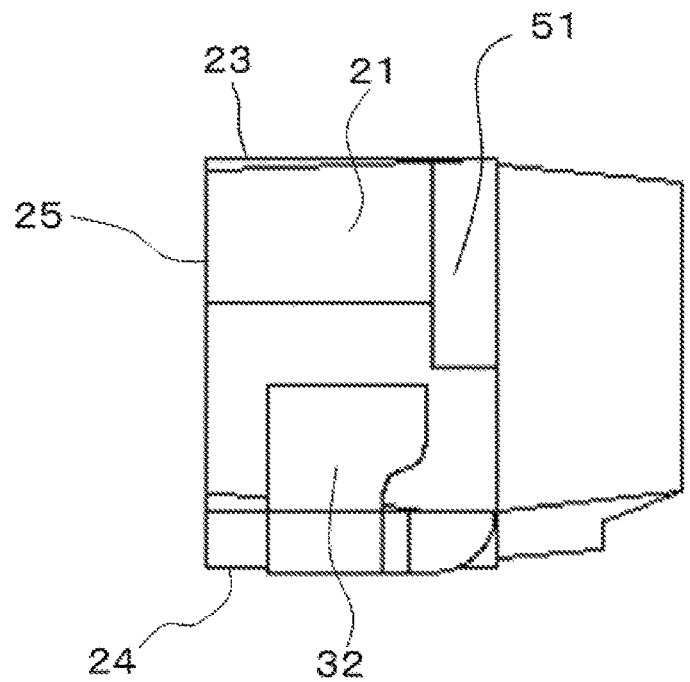
FIG. 2C is a schematic side view of a light emitting device according to an embodiment of the present disclosure.

FIG. 2A is a schematic perspective view of the light emitting device 1 according to the embodiment. FIG. 2B is a schematic front view of the light emitting device 1 according to the embodiment. FIG. 2C is a schematic side view of the light emitting device according to the embodiment. As shown in FIGS. 2A to 2C, each of the packages 2 includes the resin molded body 5. While the shape of the resin molded body 5 can be appropriately selected, the resin molded body 5 at least includes a first outer surface 21, a second outer surface 22 on the opposite side of the first outer surface 21, a third outer surface 23 between the first outer surface 21 and the second outer surface 22, and a fourth outer surface 24 opposite to the third outer surface 23. While the first outer surface 21, the second outer surface 22, the third outer surface 23, and the fourth outer surface 24 are the outer lateral surfaces of the resin molded body 5, they are also the outer surfaces that form the exterior of the package 2.

The resin molded body 5 includes the first recess 51 that is open at the first outer surface 21 and the third outer surface 23, and the second recess 52 that is open at the second outer surface 22 and the third outer surface 23. The first supporting lead 311 is fitted into the first recess 51, and the second supporting lead 312 is fitted into the second recess 52. By fitting the first supporting lead 311 and the second supporting lead 312 respectively into the first recess 51 and the second recess 52 of the resin molded body 5, the package 2 can be supported by the lead frame 3.

By virtue of the first recess 51 and the second recess 52 opening at the third outer surface 23, the first recess 51 and the second recess 52 can each have a greater width without reducing the thickness of the wall of the resin molded body 5, as compared to the case where they do not open. This enables the supporting leads 31 to each have a sufficiently great width, and consequently to firmly hold the resin molded body 5. The first recess 51 and the second recess 52 are open at the third outer surface 23, but not open at the fourth outer surface 24. This structure reduces the possibility of the supporting leads 31 coming off from the fourth outer surface 24, which may result in unintended removal of the package 2 from the lead frame 3.

Figure 3:
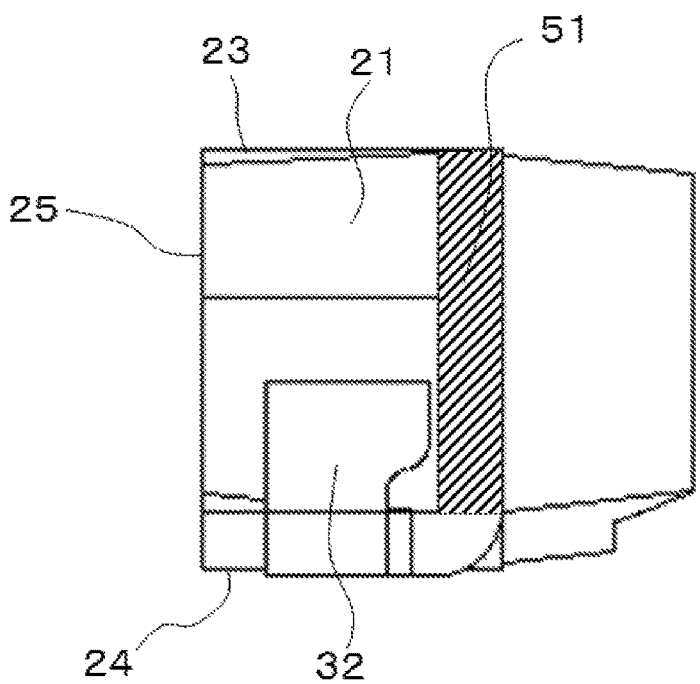
FIG. 3 is a schematic side view showing a state where a first recess is open at a fourth outer lateral surface.

FIG. 3 is a schematic side view showing a state where the first recess 51 is open at the fourth outer surface 24. The hatched part represents the first recess 51. As shown in FIG. 3, the first recess 51 and the second recess 52 may be open at the fourth outer surface 24. The first recess 51 and the second recess 52 opening at the fourth outer surface 24 enables the supporting leads 31 to each have a greater width as compared to the case where they are not open, and consequently to firmly hold the resin molded body 5. This structure allows the package 2 to be slid toward any of the third outer surface 23 and the fourth outer surface 24 (i.e., the mounting surface). Accordingly, by either the third outer surface 23 or the fourth outer surface 24 (i.e., the mounting surface) being pushed, the package 2 can be removed from the lead frame 3 from either the third outer surface 23 side or the fourth outer surface 24 (i.e., the mounting surface) side.

Removing

Figure 4:
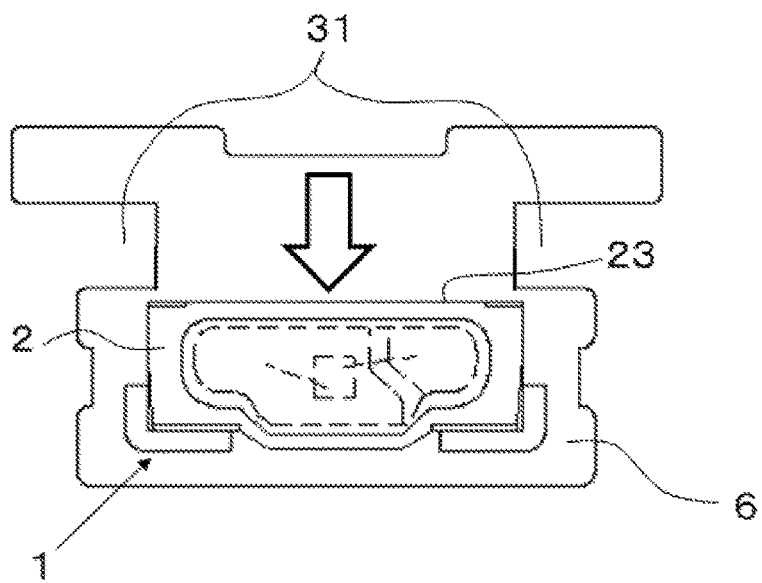
FIG. 4 is a schematic top view showing a light emitting device (i.e., a package) according to an embodiment of the present disclosure being slid.

FIG. 4 is a schematic top view showing the light emitting device 1 (i.e., the package 2) according to the embodiment being slid. In the removing step, the package 2 is removed from the lead frame 3. By the removing step, the light emitting device set 100 is singulated and a plurality of light emitting devices 1 are obtained from the light emitting device set 100.

As shown in FIG. 4, in the removing step, the package 2 is slid by the third outer surface 23 of the package 2 being pushed. Specifically, the third outer surface 23 of the package 2 is pushed using a sliding jig in the direction parallel to the upper surface of the lead frame 3, in such a manner as to slide the package 2. The sliding is performed until the third outer surface 23 of the package 2 reaches the opening 6, that is, until the package 2 is positioned in the opening 6 as seen in a top view. This removing operation releases the engagement between the first recess 51 and the first supporting lead 311 and the engagement between the second recess 52 and the second supporting lead 312, thereby removing the resin molded body 5 from the lead frame 3.

After the package 2 is slid, the package 2 is preferably dropped from the upper surface side of the lead frame 3 toward the lower surface side thereof through the opening 6. Thus, the package 2 is readily removed from the lead frame 3.

According to the manufacturing method described above, the package 2 is removed from the lead frame 3 with as little damages as possible by virtue of the package 2 being slid along the supporting leads 31, as compared to a manufacturing method in which the light emitting device 1 or the supporting leads 31 are pushed from the upper surface side in order to remove the light emitting device 1 from the lead frame 3.

Light Emitting Device 1

The above-described method of manufacturing a light emitting device provides singulated light emitting devices 1. As shown in FIGS. 2A to 2C, a singulated light emitting device 1 includes the package 2 including the resin molded body 5 and a pair of electrode leads 32, the light emitting element 4 disposed in the package 2, and a encapsulation 70. The resin molded body 5 includes at least the first outer surface 21, the second outer surface 22 on the opposite side of the first outer surface 21, the third outer surface 23 positioned between the first outer surface 21 and the second outer surface 22, the fourth outer surface 24 on the opposite side of the third outer surface 23, and a front surface 25 adjacent to the first outer surface 21, the second outer surface 22, the third outer surface 23, and the fourth outer surface 24. Further, the resin molded body 5 includes the first recess 51 that is open at the first outer surface 21 and the third outer surface 23 but is not open at the fourth outer surface 24, and the second recess 52 that is open at the second outer surface 22 and the third outer surface 23 but is not open at the fourth outer surface 24. The light emitting surface of the light emitting device 1 is referred to as the upper surface or the front surface.

The package 2 includes an element accommodating part 7 that is open at the front surface 25 and in which the light emitting element 4 is mounted. The electrode leads 32 are partially embedded in the resin molded body 5, and partially exposed on the outer surface of the package 2. The light emitting element 4 is mounted on the surface of the pair of electrode leads 32 positioned at the bottom surface of the element accommodating part 7. The encapsulation 70 is supplied in the element accommodating part 7 of the resin molded body 5.

In the following, a description will be given of the members of the light emitting device set 100, those of the composite base 10, and those of the light emitting device 1.

Package

The package 2 is a container that accommodates the light emitting element 4, and includes terminals (i.e., the electrode leads 32) for supplying the light emitting element 4 with power from an external source. The package 2 is structured by at least the resin molded body 5 and the electrode leads 32.

The maximum distance in the longitudinal direction of the package 2 is preferably 1.5 mm or smaller. In the package 2 shown in FIG. 2A, the direction from the first outer surface 21 toward the second outer surface 22 is the longitudinal direction, and the maximum distance between the first outer surface 21 and the second outer surface 22 is the maximum distance in the longitudinal direction of the package 2. Having 1.5 mm or smaller of the maximum distance in the longitudinal direction of the package 2 reduces the possibility of cracks or the like occurring on or in the resin molded body 5 due to external force applied to the package 2. From the third outer surface 23 and/or the fourth outer surface 24 of the package 2, the pair of electrode leads 32 extends.

Resin Molded Body

The resin molded body 5 is the base member of the package 2 serving as the container. The resin molded body 5 forms part of the exterior of the package 2. The resin material as the base material of the resin molded body 5 may be, for example, a thermosetting resin or a thermoplastic resin. Examples of the resin materials include modified resins and hybrid resins thereof. As compared to thermoplastic resins, thermosetting resins are preferable for their higher reliability due to their high resistance to heat and light, and a longer life. The thermosetting resins may be epoxy resins, silicone resins, polybismaleimide triazine resins, polyimide resins, polyurethane resins, unsaturated polyester resins or the like. Especially, one of an epoxy resin, a silicone resin, and an unsaturated polyester resin is preferable. In particular, unsaturated polyester resins, modified unsaturated polyester resins, and hybrid unsaturated polyester resins are preferable for their good resistance to heat and light as thermosetting resins, and moldability by injection molding, thereby exhibiting good mass productivity.

Specific resins may be those disclosed in Japanese Patent Publication No. 2013-153144, Japanese Patent Publication No. 2014-207304, Japanese Patent Publication No. 2014-123672, and others. The base material of the resin molded body may be a thermoplastic resin, which is less expensive than a thermosetting resin. The thermoplastic resin may be an aliphatic polyamide resin, a semiaromatic polyamide resin, an aromatic polyphthalamide resin, a polycyclohexylene dimethylene terephthalate, a polyethylene terephthalate, a polycyclohexane terephthalate, a liquid crystal polymer, a polycarbonate resin, or the like. Especially, one of an aliphatic polyamide resin, a polycyclohexane terephthalate, and a polycyclohexylene dimethylene terephthalate is preferable.

Thermosetting resins such as an unsaturated polyester-based resin and an epoxy resin have the above-described preferable characteristics may be used for the resin molded body for the light emitting device. Although a thermosetting resin has a viscosity lower than a thermoplastic resin, it has a flexural modulus of about, for example, 10 GPa, which may be low in flexural strength. This increases the possibility of damages on or in the package 2, such as partial cracks generated on or in the package 2 when removing the package 2 from the composite base 10 by pushing the package 2, or when handling the light emitting device 1. Nevertheless, the present embodiment effectively reduces the possibility of damages in or on the package 2 using such a resin.

When the material of the resin molded body 5 is brittle, the possibility of damages on or in the resin molded body 5 increases. Therefore, when the material of the resin molded body 5 has a flexural modulus of about 8 GPa or greater, 10 GPa or greater, or 16 GPa or greater, the present embodiment is particularly effective.

When the light emitting device 1 is thin, for example, has a height of about 0.3 mm, the strength is reduced by reducing thickness of the wall of the resin molded body 5, thereby increasing the possibility of damages on or in the package 2. Therefore, when the light emitting device 1 is thin though the resin molded body 5 is made of a thermoplastic resin having flexural modulus of about 5 GPa, the present embodiment is particularly effective.

In view of improving the light extraction efficiency of the light emitting device 1, the resin molded body 5 preferably exhibits a light reflectivity of 70% or greater, more preferably 80% or greater, further preferably 90% or greater in the light emission peak wavelength of the light emitting element 4. The resin molded body 5 is preferably white in color. Before being cured or hardened, the resin molded body 5 may be in a flowable state, that is, may be liquid (e.g., sol or slurry). The resin molded body 5 may be molded by, for example, injection molding, transfer molding or the like.

The resin molded body 5 preferably contains a white-color pigment and/or a filler. This enhances the strength of the resin molded body and reduces the possibility of damages. This structure is preferable also in view of light reflectivity and thermal expansion/contraction.

Examples of materials for the white-color pigment include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, or zirconium oxide. The foregoing materials may be used alone or in combination of two or more. Especially, titanium oxide is preferable due to its relatively high index of refraction and its good light shielding property. While the shape of the white-color pigment can be selected as appropriate and may be irregular (e.g., crushed), it is preferably spherical in view of flowability. While the particle size (hereinafter the "particle size" is defined by, for example, the average particle size D50) of the white-color pigment can be selected as appropriate, for example, it is preferably in a range of from 0.01 µm to 1 µm, and more preferably in a range of from 0.1 µm to 0.5 µm. The content of the white-color pigment in the resin molded body 5 can be selected as appropriate. While a higher content is preferable in view of the light reflectivity of the resin molded body 5, taking into consideration of the influence on the flowability, the content is preferably in a range of from 20 wt % to 70 wt %, and more preferably in a range of from 30 wt % to 60 wt %. The sign "wt %" stands for weight percent, and represents the proportion of a particular material to the total weight of the structuring materials.

The filler may be a reducing agent that reduces the thermal expansion coefficient of the resin molded body 5, and/or a reinforcing agent that reinforces the mechanical strength of the resin molded body 5. The reinforcing agent may preferably be silicon oxide or silicon dioxide (of which particle size is preferably in a range of from 5 µm to 100 µm, and more preferably in a range of from 5 µm to 30 µm). The reinforcing agent may preferably be glass, potassium titanate, calcium silicate (wollastonite) or the like. Especially, calcium silicate (wollastonite) or potassium titanate is preferable for the reinforcing agent to be contained in a thin or compact resin molded body 5, due to its relatively small particle size. In addition to the foregoing materials, aluminum oxide, mica, talc or the like may be employed as the filler. The filler may be one of the foregoing materials or a combination of two or more thereof. The material of the filler is different from that of the white-color pigment.

While the average fiber diameter of the reinforcing agent may be selected as appropriate, it is for example in a range of from 0.05 µm to 100 µm, preferably in a range of from 0.1 µm to 50 µm, more preferably in a range of from 1 µm to 30 µm, and further preferably in a range of from 2 µm to 15 µm. While the average fiber length of the reinforcing agent may be selected as appropriate, it is for example in a range of from 0.1 µm to 1 mm, preferably in a range of from 1 µm to 200 µm, more preferably in a range of from 3 µm to 100 µm, and further preferably in a range of from 5 µm to 50 µm. While the average aspect ratio (i.e., average fiber length/average fiber diameter) of the reinforcing agent may be selected as appropriate, it is for example in a range of from 2 to 300, preferably in a range of from 2 to 100, more preferably in a range of from 3 to 50, and further preferably in a range of from 5 to 30.

The shape of the filler may be selected as appropriate. The shape of the filler may be irregular (e.g., crushed), fibrous (e.g., needle-like) or plate-like (e.g., flaky). In view of flowability, a spherical-like shape is preferable. In view of the function as the reinforcing agent, a needle-like shape is preferable. In a case where the shape of the filler is a needle-like shape, the fillers can easily enter into small spaces between particles of the resin molded body and even more enhance the strength of the resin molded body. While the content of the filler in the resin molded body 5 may be determined as appropriate, taking into consideration of the thermal expansion coefficient, mechanical strength, and the like of the resin molded body 5, it is preferably in a range of from 10 wt % to 80 wt %, and more preferably in a range of from 30 wt % to 60 wt % (in the content, the content of the reinforcing agent is preferably in a range of from 5 wt % to 30 wt %, and more preferably in a range of from 5 wt % to 20 wt %).

Lead Frame

The base member of the lead frame 3 may be a plate-like member, which is made of a flat plate of metal such as copper, aluminum, gold, silver, tungsten, iron, nickel, cobalt, molybdenum, or alloy thereof, and subjected to any of various works such as pressing (including punching), etching, rolling, and the like. While the lead frame 3 may be a layered body of such metals or alloys, the lead frame 3 preferably has a single-layer structure for simplicity. In particular, copper alloy of which a main component is copper (such as phosphor bronze, copper-iron alloys and the like) is preferable due to its good heat dissipation and electrical conductivity.

Preferably, a light reflecting film of silver, aluminum, rhodium, gold or alloy thereof is provided on the surface of the lead frame 3, particularly on the surface of the electrode leads 32 exposed on the bottom surface of the element accommodating part 7, in view of improving the light extraction efficiency of the light emitting device 1. Especially, silver or silver alloy is preferable due to its good light reflectivity. In particular, a film of silver or silver alloy using a sulfur-based brightener (e.g., a plating film) is preferably used to obtain a smooth surface which provides relatively high light reflectivity. The sulfur and/or sulfur compound in the brightener is to be dispersed in the crystal grains and/or at the crystal grain boundary of silver or silver alloy (the content of sulfur is, for example, preferably in a range of from 50 ppm to 300 ppm). While the glossiness of the light reflecting film may be selected as appropriate, it is preferably 1.5 or greater and more preferably 1.8 or greater. The glossiness is the value measured using digital densitometer Model 144 available from GAM (Graphic Arts Manufacturing) Company.

Preferably, the surface of the supporting leads 31 is plated with silver or silver alloy such as those described above. This structure can protect the base material of the supporting leads 31, reduce possible rust or deterioration of the supporting leads 31, and maintain the force for supporting the package 2.

While the thickness of the lead frame 3 may be selected as appropriate according to the desired characteristics or mass productivity of the light emitting device, it may be for example in a range of from 0.05 mm to 1 mm, preferably in a range of from 0.07 mm to 0.3 mm, and more preferably in a range of from 0.1 mm to 0.2 mm. The lead frame 3 may be substantially uniform in thickness entirely, or may be partially different in thickness. When the lead frame 3 is partially different in thickness, the portions of the electrode leads 32 being bent along the resin molded body 5 are preferably reduced in thickness. This structure allows the electrode leads 32 to be easily bent, and reduces any possible twist of the lead frame 3. The lead frame 3 may have grooves or irregular shapes on its surface.

Supporting Leads

The supporting leads 31 are respectively fitted into the first recess 51 and the second recess 52 of the resin molded body 5, to support the package 2. The thickness of the supporting leads 31 may be as great as that of the lead frame 3, and is preferably in a range of 0.10 mm to 0.20 mm, for example. In the case of a great thickness, the supporting leads 31 can firmly support the package 2, however, it becomes difficult to release engagement between the supporting leads 31 and the package 2. On the other hand, in the case of a small thickness, although the supporting leads 31 can readily release engagement with the package 2, it tends to invite a twist of the lead frame 3. Accordingly, a proper thickness should be selected.

Light Emitting Element

Each light emitting element 4 may be a semiconductor light emitting element such as a light emitting diode (LED). While a light emitting element often includes a substrate, the light emitting element 4 is only required to include at least an element structure made up of various semiconductors, and a positive and negative (pn) pair of electrodes. In particular, a light emitting element of a nitride semiconductor ($In_xAl_yGa_{1-x-y}N$, $0 \le x$, $0 \le y$, $x+y \le 1$) capable of emitting light in an ultraviolet to visible light range is preferable. In view of the light emission efficiency, the color mixture with light from another light source, the excitation efficiency of the fluorescent substance, and the like, the light emission peak wavelength of the light emitting element 4 is preferably in a range of from 445 nm to 465 nm. The light emitting element 4 may be a light emitting element of a gallium arsenide-based semiconductor or a gallium phosphide-based semiconductor which emits green-color to red-color light. In the case of a light emitting element including a positive and negative pair of electrodes formed on an identical surface, the electrodes may be respectively connected to the pair of electrode leads 32 by wires, or by a conductive bonding member (i.e., flip-chip mounted). In the case of a light emitting element having the opposed-sided electrode structure in which the positive electrode is provided on opposite surface of the negative electrode, the electrode on the lower surface is connected to one of the pair of electrode leads 32 by a conductive bonding member, and the electrode on the upper surface is connected to other one of the pair of electrode leads 32 by a wire. The light emitting element 4 mounted on one package 2 may be one or more in number. When a plurality of light emitting elements is mounted on one package 2, the plurality of light emitting elements can be connected in series or parallel to each other by wires. In one package 2, for example three light emitting elements respectively emitting blue-color light, green-color light, and red-color light, or two light emitting elements respectively emitting blue-color light and green-color light may be mounted.

Encapsulation

The encapsulation 70 encapsulates the light emitting element 4, to protect the light emitting element 4 from dust, moisture, external forces, and the like. Providing the encapsulation 70 realizes protection of members including the light emitting element 4, and improves reliability of the light emitting device 1. The encapsulation 70 is preferably electrically insulating, and exhibits light transmissivity to the light emitted by the light emitting element 4. The light transmissivity of the encapsulation 70 is preferably 60% or greater, more preferably 70% or greater, and further preferably 80% or greater, in the light emission peak wavelength of the light emitting element 4. The encapsulation 70 preferably, but not essentially, contains at least a fluorescent substance in the base material.

The base material of the encapsulation 70 may be a silicone resin, an epoxy resin, a phenolic resin, a polycarbonate resin, an acrylic resin, a TPX resin, a polynorbornene resin, or a modified resin thereof, or a hybrid resin thereof. Especially, silicone-based resins (e.g., a silicone resin, a modified resin thereof, and a hybrid resin thereof) positively exhibit the effect of the present embodiment due to their low elastic modulus and particularly good resistance to heat and light, and additionally relatively high gas permeability. Among silicone-based resins, a silicone-based resin that includes a phenyl group (e.g., a methyl phenyl silicone-based resin, and a diphenyl silicone-based resin) is preferable due to its relatively high heat resistance and high gas barrier property. The content of the phenyl group in all the organic groups bonded to silicon atoms in the silicone-based resin containing a phenyl group is, for example, in a range of from 5 mol % to 80 mol %, preferably in a range of from 20 mol % to 70 mol %, and further preferably in a range of from 30 mol % to 60 mol %.

Fluorescent Substances

The encapsulation 70 may contain a fluorescent substance. The fluorescent substance absorbs at least part of primary light emitted by the light emitting element 4, and emits secondary light being different from the primary light in wavelength. This provides a light emitting device that emits mixed-color light (e.g., white-color light) of the visible wavelength obtained by the primary light and the secondary light. The fluorescent substance may be one of or a combination of two or more of the following specific exemplary substances. Specific examples of fluorescent materials that emit green-to-yellow-color light include a yttrium-aluminum-garnet-based fluorescent material (e.g., $Y_3(Al,Ga)_5O_{12}:Ce$), a lutetium-aluminum-garnet-based fluorescent material (e.g., $Lu_3(Al,Ga)_5O_{12}:Ce$), a silicate-based fluorescent material (e.g., $(Ba,Sr)_2SiO_4:Eu$), a chlorosilicate-based fluorescent material (e.g., $Ca_8Mg(SiO_4)_4Cl_2:Eu$), a β-SiAlON-based fluorescent material (e.g., $Si_{6-z}Al_zO_zN_{8-z}:Eu$ ($0<Z<4.2$)) and the like. Specific examples of fluorescent materials that emit red-color light include a nitrogen-containing calcium aluminosilicate (CASN or SCASN)-based fluorescent material (e.g., $(Sr,Ca)AlSiN_3:Eu$), or a manganese-activated potassium fluosilicate-based fluorescent material (e.g., $K_2SiF_6:Mn$). The fluorescent substance may include quantum dots. The quantum dots are particles having a size in a range of from about 1 nm to 100 nm. Depending on the particle size, the light emission wavelength can be changed. The quantum dots may be, for example, cadmium selenide, cadmium telluride, zinc sulfide, cadmium sulfide, lead sulfide, lead selenide, mercury cadmium telluride or the like.

The encapsulation 70 may contain a filler. Examples of materials of the filler contained in the encapsulation 70 include silicon oxide, aluminum oxide, zirconium oxide, zinc oxide or the like. In particular, silicon oxide is preferably employed as an agent for reducing the thermal expansion coefficient of the encapsulation 70. The filler contained in the encapsulation 70 may be used alone or in combination of two or more of the foregoing substances. While the shape of the filler contained in the encapsulation 70 may be selected as appropriate and may be irregular (e.g., crushed), a spherical shape is preferable in view of flowability. While the content of the filler in the encapsulation 70 may be determined as appropriate taking into consideration of the thermal expansion coefficient, flowability, and the like of the encapsulation 70, it is preferably in a range of from 0.1 wt % to 50 wt %, and more preferably in a range of from 1 wt % to 30 wt %. Using nanoparticles (e.g., particles having a size in a range of 1 nm to 100 nm) as the filler contained in the encapsulation 70, scattering (including Rayleigh scattering) of light having a short wavelength such as blue-color light from the light emitting element 4 can be increased, and therefore the amount of the fluorescent substance used can be reduced. The nanoparticles are made of, for example, preferably silicon oxide or zirconium oxide.

In the foregoing, the embodiment has been described. These explanations, however, relate to examples, and do not in any way limit the constructions specified in the claims section.

The invention claimed is:

1. A method of manufacturing a light emitting device, comprising:
   providing a light emitting device set that includes
      a lead frame including a plurality of pairs of supporting leads each of which pairs consists of a first supporting lead and a second supporting lead,
      a plurality of packages respectively supported by the plurality of pairs of supporting leads, and
      a plurality of light emitting elements respectively mounted on the plurality of packages; and
   removing the plurality of packages from the lead frame,
      wherein the packages each include a resin molded body,
      the resin molded body includes
         a first outer surface supported by the first supporting lead,
         a second outer surface positioned opposite to the first outer surface and supported by the second supporting lead,
         a third outer surface positioned between the first outer surface and the second outer surface,
         a fourth outer surface positioned opposite to the third outer surface,
         a first recess that is open at the first outer surface and the third outer surface, and
         a second recess that is open at the second outer surface and the third outer surface,
         wherein the first supporting lead fits into the first recess, and the second supporting lead fits into the second recess, and
      wherein the packages are each removed from the lead frame by the third outer surface being pushed.

2. The method of manufacturing a light emitting device according to claim 1, wherein
   the lead frame has a plurality of openings,
   after the packages are removed from the lead frame, the packages are respectively dropped though the openings from an upper surface side of the lead frame to a lower surface side of the lead frame.

3. The method of manufacturing a light emitting device according claim 1, wherein the first recess and the second recess are further open at the fourth outer surface.

4. The method of manufacturing a light emitting device according to claim 1, wherein
   the packages each include an element accommodating part that houses the light emitting element,
   the lead frame includes a plurality of pairs of electrode leads, and
   the electrode leads are partially exposed on a bottom surface of the element accommodating part.

5. The method of manufacturing a light emitting device according to claim 4, wherein the electrode leads extend from at least one of the third outer surface and the fourth outer surface.

6. A composite base comprising:
   a lead frame including a plurality of pairs of supporting leads each of which pairs consists of a first supporting lead and a second supporting lead; and
   a plurality of packages respectively supported by the plurality of pairs of supporting leads, wherein
   the packages each include a resin molded body,
   the resin molded body includes
      a first outer surface supported by the first supporting lead,
      a second outer surface positioned opposite to the first outer surface and supported by the second supporting lead,
      a third outer surface positioned between the first outer surface and the second outer surface,
      a fourth outer surface positioned opposite to the third outer surface,
      a first recess that is open at the first outer surface and the third outer surface, but is not open at the fourth outer surface, and
      a second recess that is open at the second outer surface and the third outer surface, but is not open at the fourth outer surface, wherein
   the first supporting lead fits into the first recess, and the second supporting lead fits into the second recess.

7. The composite base according to claim 6, wherein the lead frame has a plurality of openings.

8. The composite base according to claim 6, wherein
   the packages each include an element accommodating part,
   the lead frame includes a plurality of pairs of electrode leads, and
   the electrode leads are partially exposed on a bottom surface of the element accommodating part.

9. The composite base according to claim 8, wherein the electrode leads extend from at least one of the third outer surface and the fourth outer surface.

10. The composite base according to claim 6, wherein a maximum distance between the first outer surface and the second outer surface is 1.5 mm or smaller.

11. The composite base according to claim 6, wherein a resin material of the resin molded body is a thermosetting resin.

12. The composite base according to claim 6, wherein a resin material of the resin molded body is an unsaturated polyester-based resin.

13. The composite base according to claim 6, wherein a resin material of the resin molded body is an epoxy-based resin.

14. The composite base according to claim 6, wherein the resin molded body contains at least one of a white-color pigment and a filler.

* * * * *